United States Patent
Constantinidis et al.

(10) Patent No.: US 6,792,254 B1
(45) Date of Patent: Sep. 14, 2004

(54) METHOD OF COMPARING THE AMPLITUDES OF TWO ELECTRIC SIGNALS

(75) Inventors: Nicolas Constantinidis, Cresserons (FR); Guillaume Crinon, Douvres la Delivrande (FR); Sylvain Chabanne, Asniere sur Seine (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 532 days.

(21) Appl. No.: 09/671,128

(22) Filed: Sep. 27, 2000

(30) Foreign Application Priority Data

Sep. 28, 1999 (FR) ............................................ 99 12066

(51) Int. Cl.[7] .................................................. H04B 1/06
(52) U.S. Cl. ............................... 455/232.1; 455/226.1; 455/234.1; 375/345
(58) Field of Search .......................... 455/232.1, 234.1, 455/234.2, 249.1, 245.1, 245.2, 247.1, 250.1, 324, 226.1; 375/329, 345; 329/304; 330/278, 291

(56) References Cited

U.S. PATENT DOCUMENTS

| | | | | |
|---|---|---|---|---|
| 4,799,212 A | * | 1/1989 | Mehrgardt | 370/206 |
| 4,926,443 A | * | 5/1990 | Reich | 375/349 |
| 5,548,619 A | * | 8/1996 | Horiike et al. | 375/344 |
| 5,841,889 A | * | 11/1998 | Seyed-Bolorforosh | 382/128 |

* cited by examiner

*Primary Examiner*—Quochien B. Vuong

(57) ABSTRACT

An apparatus and method for comparing the amplitudes of two electric signals Iout and Qout are disclosed. The method includes a step wherein powers conveyed by the signals Iout and Qout are compared. One feature of the method and apparatus is that it is not necessary to storing the maxima of the signals to be compared when these signals are out of phase with respect to each other. One application of the method or apparatus is for the correction of differences in amplitude between I, Q signals that are separated in phase by 90° inside QAM, QPSK or QBSK demodulators.

2 Claims, 2 Drawing Sheets

METHOD OF COMPARING THE AMPLITUDES OF TWO ELECTRIC SIGNALS

Figure 1:
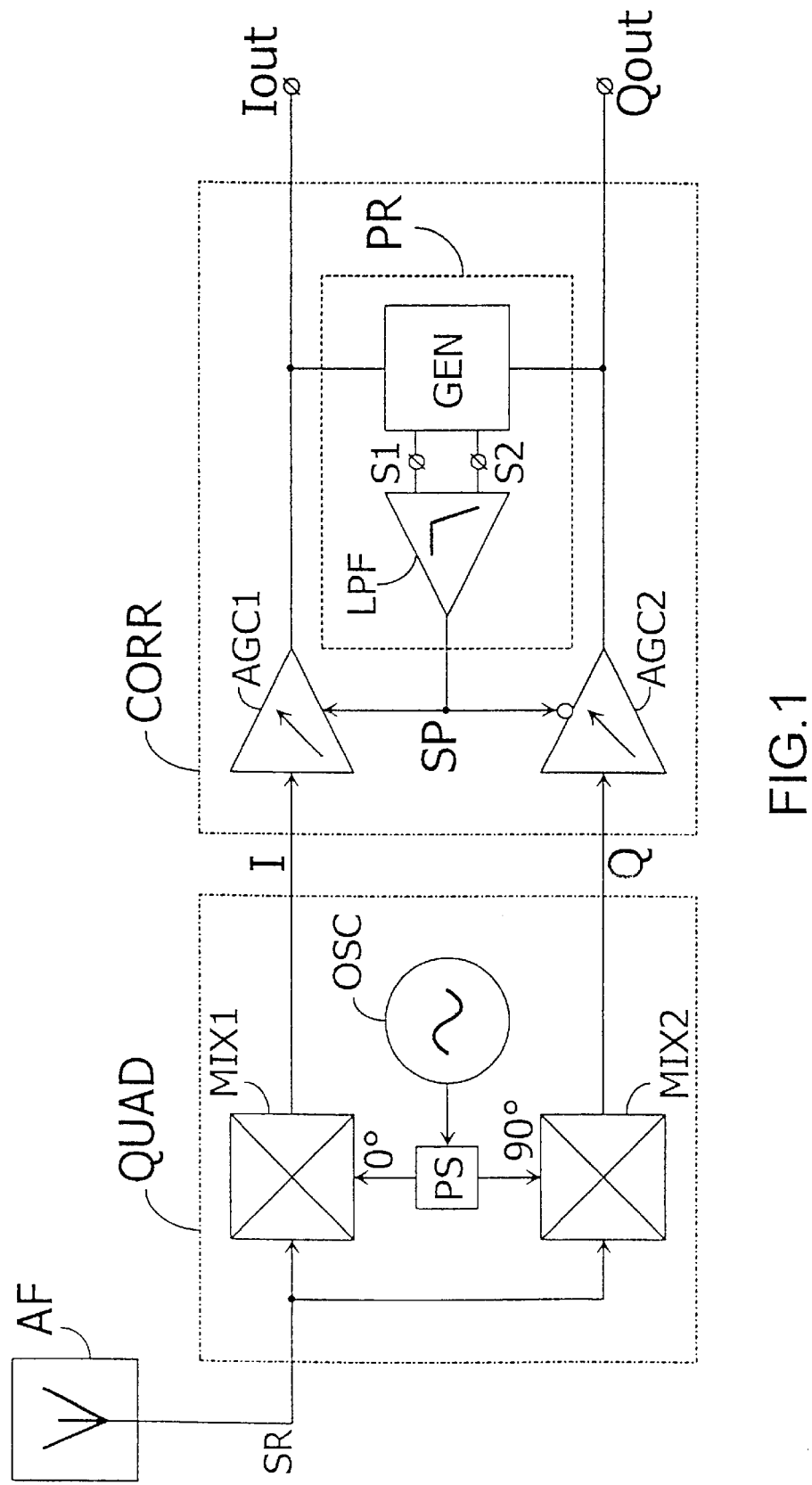

The invention relates to a method of comparing the amplitudes of two electric signals.

Such comparisons are frequently carried out in all types of electronic circuits, for example, with a view to perform gain controls. It may be easy to compare the amplitudes of two synchronous signals using simple comparators, however, it is a different matter when said signals are out of phase. In the latter case, such signals reach maximum and minimum values at different moments in time and an instantaneous comparison between said signals is no longer representative of their possible difference in amplitude. Most methods enabling such signals to be compared make use of storage stages to store the maximum values of the signals, which in certain cases involves analog-to-digital conversion of said signals in order to store and compare the maximum or minimum values of these signals in digital form. Such methods require complex and hence expensive structures, both in terms of silicon surface area and in terms of energy consumption.

It is an object of the invention to overcome these drawbacks by means of a method which enables amplitudes of two signals to be compared without requiring any storage of these signals.

A method as described in the opening paragraph is characterized in accordance with the invention in that the method includes a stage wherein powers conveyed by said signals are compared.

This method makes use of the fact that the power conveyed by a signal is representative of its amplitude. Thus, in accordance with the invention, it is no longer necessary to simultaneously have the amplitude values of each one of the signals in order to compare them instantaneously, which is difficult when the signals are out of phase. It is sufficient to develop, for each signal, some data representative of the power it conveys, said data being phase-independent.

In accordance with a variant of the invention, a method as described hereinabove is characterized in that it includes a stage wherein a value is generated that is representative of a difference between the mean values of the squares of the amplitudes of these signals.

This method combines, in a single step, the development of data representative of the powers conveyed by the signals, and a comparison between these data.

The method in accordance with the invention can be advantageously used to correct amplitude differences between two signals. In one of its possible applications, the invention thus also relates to a method which cyclically carries out the following operations:
comparison between the amplitudes of said two signals, and amplification of the signal having the smallest amplitude, and, simultaneously, attenuation of the signal having the highest amplitude,
which method is characterized in that the comparison between the amplitudes of the signals is carried out by means of a method as described hereinabove.

In one of its embodiments, the invention also relates to a device for comparing the amplitudes of a first and a second input signal, characterized in that this device includes means for comparing the powers conveyed by said signals.

In another embodiment, the invention relates to a correction device for correcting a difference in amplitude between a first and a second input signal, comprising:
a device for comparing the amplitudes of the first and the second input signal as described hereinabove, and
a first and a second variable-gain amplifier provided with signal inputs for receiving, respectively, the first and the second input signal, and with signal outputs for supplying its input signals to the comparison device, and with gain control inputs for receiving, from the comparison device, signals which are representative of a difference between the amplitudes of the output signals of the first and the second amplifier.

The invention can be used in all types of electric circuits, however, it can be particularly advantageously used to correct amplitude differences which may occur during demodulation of a radio frequency signal. Thus, the invention also relates to a receiving device for receiving a radio signal, which device comprises:
a quadratic module for supplying two output signals separated in phase by 90°, the phases of which are representative of data conveyed by the radio signal, and
a correction device for correcting a difference in amplitude between the output signals of the quadratic module,
which receiving device accommodates the correction device as described hereinabove.

These and other aspects of the invention will be apparent from and elucidated with reference to the embodiment(s) described hereinafter.

Figure 2:
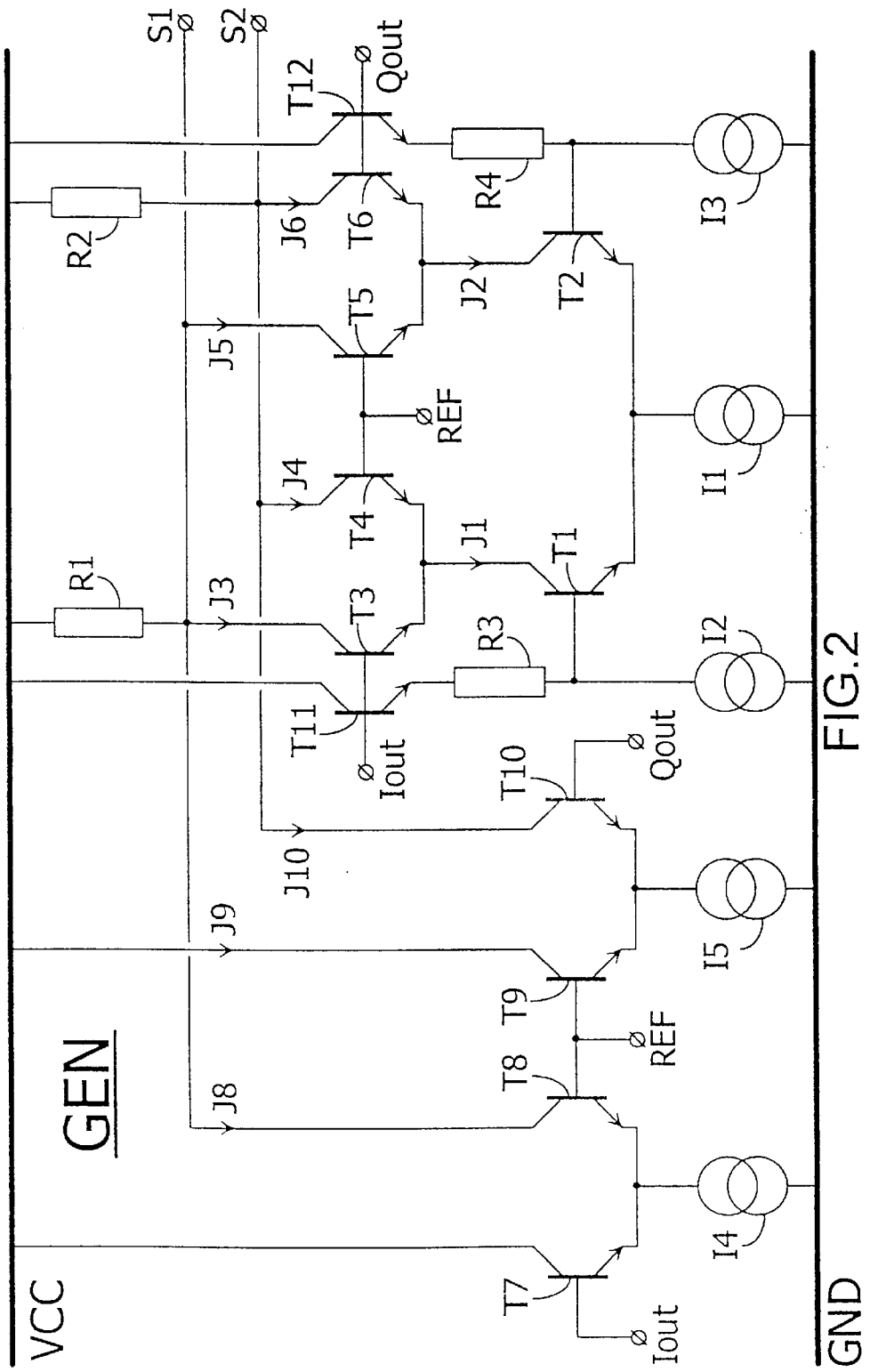

In the drawings:

FIG. 1 shows a part of a functional diagram depicting a device for receiving radio signals as used to implement the invention, and FIG. 2 is an electrical circuit diagram of a specific element included in such a device.

FIG. 1 diagrammatically shows a receiving device intended to receive a radio signal, which receiving device comprises:
a quadratic module QUAD for supplying two output signals, I and Q, which are separated in phase by 90°, the phases being representative of data conveyed by the radio signal, and
a correction device CORR for correcting a difference in amplitude between the output signals I and Q of the quadratic module QUAD.

The receiving device comprises an antenna and filtering device AF intended to perform the reception of the radio signal and its conversion into an electronic signal SR, which can be exploited by the device. The quadratic module QUAD comprises a first and a second mixer, MIX1 and MIX2, respectively, intended to supply the output signals I and Q of the quadratic module QUAD, an oscillator OSC for supplying an output signal at a given frequency, which is generally adjustable, and a phase shifter PS which performs a 90° phase shift of the output signal of the oscillator OSC. The first mixer MIX1 receives the radio signal SR and the non-phase shifted output signal of the oscillator OSC, while the second mixer MIX2 receives the radio signal SR and a signal that exhibits a 90° phase shift with respect to the output signal of the oscillator OSC. Thus, the output signals I and Q of the quadratic module QUAD have the same frequency, equal to the difference between the frequency of the radio signal SR and the frequency of the output signal of the oscillator OSC, and said output signals are separated in phase by 90°, and their phase is representative of data conveyed by the radio signal SR. This type of processing of the radio signal, whereby the demodulation of the radio signal is prepared, is customarily used in demodulators of the QAM, QPSK or even BPSK type.

Processing of the radio signal SR by the quadratic module QUAD may cause a difference in amplitude between its output signals I and Q, which adversely affects the demodulation to be carried out by the device. Such a difference will be corrected by the correction device CORR, which comprises:

- a first and a second variable-gain amplifier, AGC1 and AGC2, provided with signal inputs for receiving the output signals I and Q of the quadratic module QUAD, and outputs for supplying output signals Iout and Qout of the correction device CORR, and
- a product module PR intended to receive the output signals Iout and Qout and to generate an output signal SP whose value is representative of a difference between the powers conveyed by said signals Iout and Qout, and hence of the result of a comparison between the amplitudes of these signals.

The first and second amplifiers AGC1 and AGC2 are provided with gain-control inputs for receiving the output signal SP of the product module PR. In the example described here, these control inputs are inverted with respect to each other, so that a difference in amplitude between the two signals Iout and Qout causes an amplification of the signal whose amplitude is lowest, and, simultaneously, an attenuation of the signal whose amplitude is highest. By virtue thereof, it is possible to use the same structure to construct the amplifiers AGC1 and AGC2, only the wiring of the control inputs of the two amplifiers being different. To make sure that the device brings about an optimum demodulation, it is indeed necessary for the output signals Iout and Qout to follow paths which are as symmetrical as possible. The amplifiers AGC1 and AGC2 can be realized in various forms, well known to those skilled in the art, for example using Gilbert cells.

In this example, the product module PR comprises a so-called generation module GEN having two output terminals S1 and S2 which serve to supply an output signal which is representative of the difference between the squares of the signals Iout and Qout. The product module PR also comprises a low-pass filter LPF, intended to receive the signal generated by the generation module GEN. This filter can be composed of, for example, a capacitance arranged between the output terminals S1 and S2 of the generation module GEN. It is well known that a low-pass filter has an averaging effect on the signal that it receives. The signal SP supplied by the low-pass filter LPF thus is representative of the difference between the powers conveyed by the signals Iout and Qout, which powers are expressed in the form of mean values of the squares of the amplitudes of these signals Iout and Qout. Thus, the signal SP is representative of the result of a comparison between the amplitudes of the output signals Iout and Qout of the correction device CORR. Although the signals Iout and Qout are separated in phase by 90°, no storage is necessary to elaborate the signal SP.

FIG. 2 is an electrical circuit diagram showing an embodiment of the generation module GEN, which comprises in this example:

- a first and a second transistor T1 and T2, which form a first differential pair,
- a third and a fourth transistor T3 and T4, which form a second differential pair,
- a fifth and a sixth transistor T5 and T6, which form a third differential pair,
- a seventh and an eighth transistor T7 and T8, which form a fourth differential pair,
- a ninth and a tenth transistor T9 and T10, which form a fifth differential pair.

Each transistor is provided with a control terminal, a transfer terminal and a reference terminal. In this example, the transistors used are bipolar transistors whose bases, collectors and emitters form, respectively, the control terminals, the transfer terminals and the reference terminals. It would also be possible to use transistors of the MOS type whose gates, drains and sources would then form the control terminals, the transfer terminals and the reference terminals.

The transfer terminal of the first transistor T1 is connected to the reference terminals of the third and fourth transistors T3 and T4, the transfer terminal of the second transistor T2 being connected to the reference terminals of the fifth and sixth transistors T5 and T6.

The control terminals of the first, third and seventh transistors, T1, T3 and T7, respectively, are intended to receive the signal Iout.

The control terminals of the second, sixth and tenth transistors, T2, T6 and T10, respectively, are intended to receive the signal Qout.

The control terminals of the fourth, fifth, eighth and ninth transistors, T4, T5, T8 and T9, respectively, are intended to receive the same reference signal REF.

This signal REF is advantageously chosen so as to be a DC signal whose nominal value is equal to that of the DC components present in the signals Iout and Qout.

The transfer terminals of the third, fifth and eighth transistors, T3, T5 and T8, respectively, are connected to a supply terminal VCC via a first resistor R1. The transfer terminals of the fourth, sixth and tenth transistors, T4, T6 and T10, respectively, are connected to said supply terminal VCC via a second resistor R2.

The transfer terminals of the third and sixth transistors, T3 and T6, respectively, form the output terminals S1 and S2 of the generation module GEN.

The transfer terminals of the seventh and ninth transistors, T7 and T9, respectively, are connected to the supply terminal VCC.

The first, fourth and fifth differential pairs are polarized by first, fourth and fifth current sources, I1, I4 and I5, respectively. These current sources are advantageously embodied so as to produce currents which all have an identical nominal value, referred to as J.

The current flowing via the transfer terminal of the $i^{th}$ transistor Ti (i=1 to 10) is referenced Ji. The output signal supplied by the generation module GEN between its output terminals S1 and S2 is expressed as follows: $V(S1)-V(S2) = VCC - R_1 \cdot (J3+J5+J8) - [VCC - R_2 \cdot (J4+J6+J10)]$. If the nominal values of the first and second resistors R1 and R2 are chosen to be equal to an equal value R, then the output signal is expressed as follows: $R \cdot [(J4+J6+J10)]-(J3+J5+J8)]$.

The expression of the currents flowing via the transfer terminals of the transistors forming the different differential pairs can be deduced from the following formulas:

$$J1 = J/2 \cdot [1 + \tan h((Iout - Qout)/2 \cdot Vt)],$$

and $$J2 = J/2 \cdot [1 - \tan h((Iout - Qout)/2 \cdot Vt)],$$

where tan h represents the hyperbolic tangent function, and $Vt = k \cdot T/q$, where k is the Boltzmann's constant, T is the absolute temperature and q is the elementary charge. Besidesly, close to zero, the function tan h(x) is equivalent to x. Now, the signals Iout and Qout can be expressed as, REF+iout and REF+qout, respectively, where iout and qout are AC-components whose amplitude is weak with respect to the value of the reference signal REF.

The combination of the above-mentioned equations enables the following expression to be obtained the output signal of the generation module GEN:

$$V(S1)-V(S2)=J/2.(i\text{out}^2-q\text{out}^2)/(2.Vt)^2.$$

This output signal is thus proportional to the difference between the squares of the AC-components of the signals Iout and Qout, and hence representative of the difference between the squares of the amplitudes of these signals. This output signal V(S1)–V(S2) is applied to an input of the low-pass filter LPF, an output of which supplies the signal SP, which is thus representative of a comparison between the powers conveyed by the signals Iout and Qout.

The fourth and fifth differential pairs enable the subtraction of a part of the harmonic content that would be present in the output signal of a generation module constituted only by the first, second and third differential pairs. Such a generation module would deliver, however, an output signal of which the main component would be representative of the difference between the squares of the amplitudes of the signals Iout and Qout, with an inferior spectral purity.

It is to be noted that, among other advantages, the symmetry of the structure described in this embodiment of the generation module GEN, as well as the fact that the value of REF is chosen equal to the value of the DC components of the signals Iout and Qout, renders the output signal V(S1)–V(S2) of the generation module GEN almost unsensitive to variations in the value of the reference signal REF.

What is claimed is:

1. A device for comparing amplitudes of a first and a second input signal, comprising:

a product module arranged to generate data representative of powers conveyed by the two signals and compare the data in a single process, wherein the product module generates an output signal whose value is representative of a difference between mean values of squares of amplitudes of said the two input signals, and wherein the product module comprises:

a first and a second transistor forming a first differential pair, a third and a fourth transistor forming a second differential pair, a fifth and a sixth transistor forming a third differential pair, each transistor being provided with a control terminal, a transfer terminal and a reference terminal, the transfer terminal of the first transistor being connected to the reference terminals of the third and fourth transistors, the transfer terminal of the second transistor being connected to the reference terminals of the fifth and sixth transistors, the control terminals of the first and third transistors being intended to receive the first input signal, the control terminals of the second and sixth transistors being intended to receive the second input signal, the control terminals of the fourth and fifth transistors being intended to receive a same reference signal, the transfer terminals of the third and fifth transistors being connected to a supply terminal via a first resistor, the transfer terminals of the fourth and sixth transistors being connected to said supply terminal via a second resistor, the product module comprising, moreover, a low-pass filter, intended to receive an input signal drawn from the transfer terminals of the third and sixth transistors, and to supply the output signal of the product module.

2. A device for comparing as claimed in claim 1, wherein the product module further comprises:

a seventh and an eighth transistor forming a fourth differential pair, a ninth and a tenth transistor forming a fifth differential pair, wherein each of said transistors being provided with a control terminal, a transfer terminal and a reference terminal, the control terminal of the seventh transistor being intended to receive the first input signal, the control terminal of the tenth transistor being intended to receive the second input signal, the control terminals of the eighth and ninth transistors being intended to receive a same reference signal, the transfer terminals of the eighth and tenth transistors being connected, respectively, to the supply terminal via the first and second resistors.

* * * * *